(12) United States Patent
Berberich et al.

(10) Patent No.: US 7,209,361 B2
(45) Date of Patent: Apr. 24, 2007

(54) ELECTRONIC DEVICE

(75) Inventors: Reinhold Berberich, Frankfurt (DE);
Dieter Busch, Rosbach (DE); Reinfried Grimmel, Friedberg (DE)

(73) Assignee: Siemens Aktiengesellschaft, Munich (DE)

( * ) Notice: Subject to any disclaimer, the term of this patent is extended or adjusted under 35 U.S.C. 154(b) by 137 days.

(21) Appl. No.: 10/914,458

(22) Filed: Aug. 9, 2004

(65) Prior Publication Data
US 2005/0041400 A1    Feb. 24, 2005

(30) Foreign Application Priority Data
Aug. 8, 2003    (DE)    .................... 103 36 634

(51) Int. Cl.
*H05K 7/02*    (2006.01)
*H05K 7/06*    (2006.01)
*H05K 7/08*    (2006.01)
*H05K 7/10*    (2006.01)

(52) U.S. Cl. ............... 361/760; 361/749; 361/816; 174/254; 174/521

(58) Field of Classification Search ........ 361/749–750, 361/816, 818; 174/254–258, 35 R; 257/660
See application file for complete search history.

(56) References Cited

U.S. PATENT DOCUMENTS 5,004,639 A * 4/1991 Desai ................. 428/138
5,121,297 A * 6/1992 Haas .................. 361/751
5,436,803 A * 7/1995 Annis et al. ............ 361/818
5,717,556 A * 2/1998 Yanagida .............. 361/803
6,665,191 B2 * 12/2003 Blood et al. ........... 361/749
6,674,344 B2    1/2004 Berberich
6,761,068 B1 * 7/2004 Schmid .............. 73/504.14
6,781,727 B2 * 8/2004 Auracher et al. ........ 398/163
6,934,160 B2 * 8/2005 Heismann et al. ....... 361/749

FOREIGN PATENT DOCUMENTS

DE    101 13 912 A1    10/2002
WO    WO 96/04773    2/1996

* cited by examiner

*Primary Examiner*—Tuan Dinh
(74) *Attorney, Agent, or Firm*—Cohen Pontani Lieberman & Pavane LLP

(57) ABSTRACT

An electronic device includes a first module, which is protected against electromagnetic interference, and a second module. At least the first module has multilayer printed circuit boards with at least one inner layer with conductor tracks. The at least one inner layer forms flexible connections between the printed circuit boards of the first and second modules. The at least one inner layer forms a bushing capacitor together with other conductor tracks of the first module.

5 Claims, 1 Drawing Sheet

ELECTRONIC DEVICE

BACKGROUND OF THE INVENTION

1. Field of the Invention

The invention relates to an electronic device having a first module, which is protected against electromagnetic interference, and a second module.

2. Description of the Related Art

Electronic circuits in which very small voltages and currents are processed often need to be protected against electromagnetic interference by a shielding housing. For various reasons it has proved to be expedient to protect only the parts of devices which have this sensitivity. In particular in control devices and motor vehicles, for example in sensor applications, such as rotation rate sensors, extremely small signal currents occur. Such devices are therefore provided with a shielding housing. In addition to the circuits which are sensitive to this extent there are often also evaluation circuits which operate in particular on a digital basis and are not sensitive to the same extent.

SUMMARY OF THE INVENTION

An object of the present invention is to design a device having a first module that is sensitive to electromagnetic interference and a second module which is not sensitive to the electromagnetic registration, such that the device is matched as well as possible to the respective installation situation, taking into consideration protection against electromagnetic interference.

The object of the present invention is achieved by a device in which at least the first module has a multilayer printed circuit board having at least one inner layer with conductor tracks, and that the at least one inner layer forms flexible connections between the printed circuit boards of the first and second modules. The at least one inner layer forms at least one bushing capacitor with other conductor tracks of the first module.

The printed circuit boards may be any type of substrates having conductors applied to them. The second module, like the first, may contain electronic circuits. Alternatively, the second module may also have a different design such as, for example, a multiway plug connector.

The device according to the invention has the advantage that the most sensitive parts, i.e., the parts in the first module, are shielded, and the installation positions of each of the first and second two modules can be matched to the geometric conditions present in each case.

The second module may be connected in any desired manner to the flexible connection. However, provision is preferably made for the flexible connections to be continued as conductor tracks in the second module. This makes allows that first and second modules and the extensions to be produced in the extended state at the same time. The appropriate angle for a particular installation location is then set by a simple folding or bending of the flexible connection.

The flexible conductor tracks may have two or more planes forming the connections between the modules, wherein at least one of the planes acts as a shield for the at least one remaining plane.

Depending on the function and the design of the modules, the device according to the invention may be matched to many applications. For example, the first module may contain a sensor which requires a predetermined installation position in a motor vehicle and the second module may contain electronic circuits for operating the sensor which do not need to be protected against electromagnetic interference to the same extent as the sensor, it being possible for the second module to be mounted at a largely predetermined angle with respect to the first module. This particular embodiment is particularly favorable in the case of rotation rate sensors in motor vehicles, owing to the fixed installation position of the sensor.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
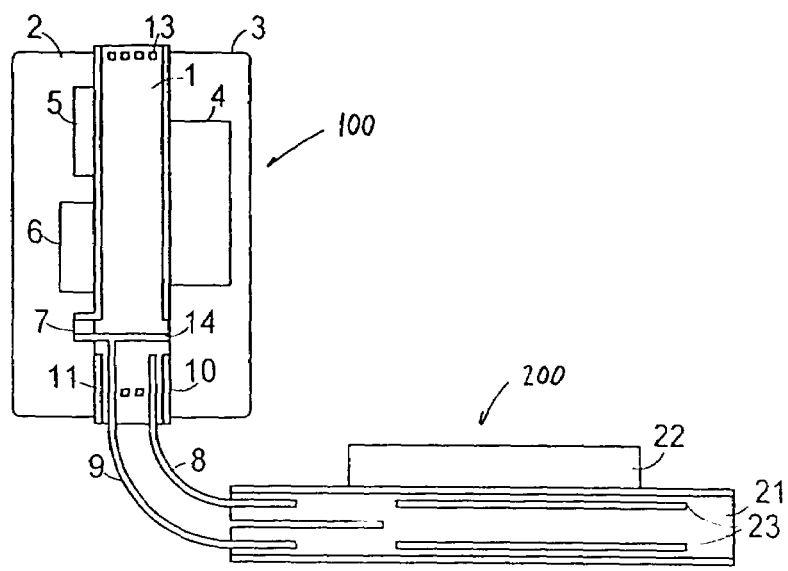
FIG. 1 is a sectional view of an electronic device according to a first embodiment of the present invention.
Figure 2:
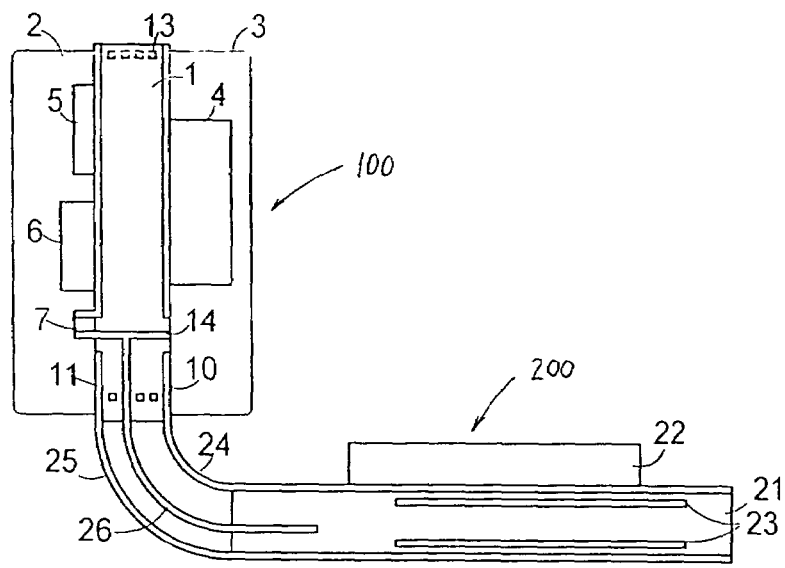
FIG. 2 is a sectional view of an electronic device according to a second embodiment of the present invention.

In the sectional views shown in FIGS. 1 and 2, the thicknesses of the printed circuit boards are shown in an exaggerated fashion so that the individual layers, in particular the conductor tracks, are clearly depicted. A first module 100 contains a printed circuit board 1 with a sensor 4 and various other components 5, 6, 7. The first module 100 is surrounded by two halves 2, 3 of a shielding housing. The shielding housing 2, 3 is pressed into holes in the printed circuit board 1, for which purpose the edges of the printed circuit board 1 are provided with holes 15 (see FIG. 3).

A second module 200 comprises a printed circuit board 21 and a component 22 positioned on top. Only a few conductor tracks of the printed circuit boards 1, 21 illustrated in section are visible. For clarity, only a few of the individual conductor tracks or conductor track sections, which are embedded in the insulating material and are normally provided in large numbers, are illustrated. In both exemplary embodiments, the printed circuit boards 1, 21 are coated on both outer faces. This coating acts at the same time as a shield and is connected (not shown) to a ground connection, as are the halves 2, 3 of the shielding housing.

Figure 3:
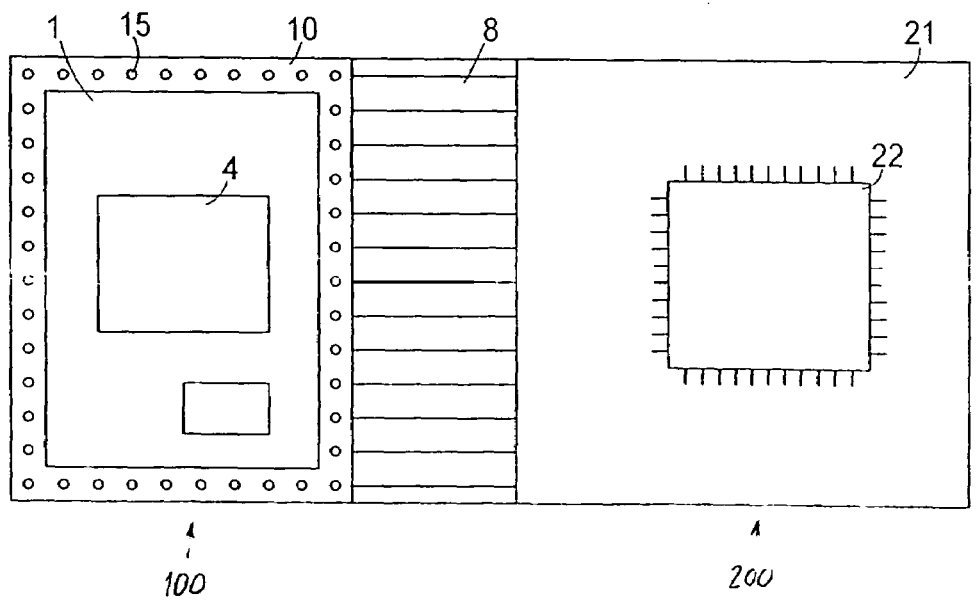
FIG. 3 is a plan view of an device of the present invention in the extended state with no shielding housing fitted.

To explain the option of a plated-through section, plated-through section 14 is depicted which, together with an outer conductor track, is connected to the connections of a component 7. The plated-through section 14 also contacts a conductor track 9 which passes out of the first module 100 and forms a connection to the second module 200. It is noted that FIGS. 1 and 2 depict only one conductor track 9, 26, whereas the parallel conductor tracks are depicted in FIG. 3. A further group of conductor tracks 8 likewise connects the first module 100 to the second module 200. On entering the first module 100, the conductor tracks 8, 9 are routed parallel to ground-connected layers 10, 11. Thus, bushing capacitors, which keep radio-frequency interference on the conductor tracks 8, 9 away from the first module 100, are respectively formed between conductor tracks 8 and 9 and other conductor tracks of the first module 100, e.g. the around-connected layers 10, 11. Further bushing capacitors are illustrated at 13. Further conductor tracks 23 within the second module 200 are illustrated.

The flexible conductor tracks 8, 9 in FIG. 1 are intended to transmit signals. It is also possible for individual conductor tracks of one group (see FIG. 3) to be connected to ground. In the exemplary embodiment shown in FIG. 2, the flexible conductor tracks 24, 25 act as a shield for the flexible conductor tracks 26.

Although the device according to the invention has many different intended uses, for example in radio receivers, it has proven particularly advantageous for it to be mounted in a motor vehicle.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronic device, comprising:
a first module including a multilayer printed circuit board having at least one inner layer with conductor tracks, at least one electronic component, and a shield protecting said entire first module against electromagnetic interference, at least some of said conductor tracks of said at least one inner layer forming bushing capacitors together with other conductor tracks of said first module, said bushing capacitors being designed to prevent radio-frequency interference on said conductor tracks of said inner layer from entering into said first module; and
a second module including a multilayer printed circuit board, wherein said at least one inner layer of said first module forms flexible connections between said printed circuit boards of said first and second modules.

2. The device of claim 1, wherein said flexible connections are continued as conductor tracks in said second module.

3. The device of claim 1, wherein said flexible connections comprise two or more planes, and wherein at least one of the planes acts as a shield for the at least one remaining plane.

4. The device of claim 1, wherein said at least one electronic component of said first module comprises a sensor, and said second module comprises electronic circuits for operating said sensor which do not require the protection against electromagnetic interference afforded by said shield, an installation position of said second module relative to said first module being adjustable by bending the flexible connections.

5. The device of claim 4, wherein said sensor comprises a rotation rate sensor for a motor vehicle.

\* \* \* \* \*